United States Patent
Tan et al.

(10) Patent No.: US 7,741,835 B2
(45) Date of Patent: Jun. 22, 2010

(54) ELECTRIC METER HAVING A DETACHABLE MEASURING BAR

(75) Inventors: Po-Chao Tan, Chung-Ho (TW); Yi-Li Tan, Chung-Ho (TW)

(73) Assignee: Brymen Technology Corporation, Taipei (TW)

( * ) Notice: Subject to any disclaimer, the term of this patent is extended or adjusted under 35 U.S.C. 154(b) by 387 days.

(21) Appl. No.: 11/953,259

(22) Filed: Dec. 10, 2007

(65) Prior Publication Data

US 2009/0146644 A1  Jun. 11, 2009

(51) Int. Cl.
 *G01R 31/28* (2006.01)
(52) U.S. Cl. .................................... 324/158.1
(58) Field of Classification Search ............... 324/765, 324/761–762, 754, 158.1; 439/482, 169, 439/174, 912
See application file for complete search history.

(56) References Cited

U.S. PATENT DOCUMENTS 2,641,630 A * 6/1953 Goldberger et al. ........ 324/72.5
3,555,420 A * 1/1971 Schwartz .................... 324/149
D427,534 S    7/2000 Beha
6,276,956 B1 * 8/2001 Cook ......................... 439/482
6,404,215 B1 * 6/2002 Nightingale et al. ........ 324/754
6,949,919 B1 * 9/2005 Cannon ..................... 324/72.5

FOREIGN PATENT DOCUMENTS

TW    578913    3/2004

* cited by examiner

Primary Examiner—Ha Tran T Nguyen
Assistant Examiner—Tung X Nguyen
(74) Attorney, Agent, or Firm—Chun-Ming Shih

(57) ABSTRACT

An electric meter having a detachable measuring bar includes a main body, a first measuring bar and a second measuring bar assembly. One end of the main body is formed with a supporting portion. The first measuring bar has a connecting portion and a probe formed at the other end of the connecting portion. The connecting portion is detachably connected with the supporting portion of the main body. The second measuring bar assembly comprises a second measuring bar and a lead. Both ends of the lead are connected to the main body and the second measuring bar. Via this arrangement, when the first measuring bar is worn or damaged in use, the first measuring bar can be replaced, thereby reducing the purchasing cost of the electric meter.

4 Claims, 5 Drawing Sheets

ELECTRIC METER HAVING A DETACHABLE MEASURING BAR

BACKGROUND OF THE INVENTION

1. Field of the Invention

The present invention relates to an electric meter, and in particular to an electric meter that can be used to measure resistance, voltage or current.

2. Description of Prior Art

A conventional electric meter constituted of measuring bars and a main body is, for example, disclosed in Taiwan Patent Publication No. 578913, which includes a main body and two measuring bar assemblies. The measuring bar assembly comprises a measuring bar and a lead with both ends thereof connected to the main body and the measuring bar respectively. In use, the two measuring bars are brought into contact with an article to be measured, so that the main body can display data, such as voltage, resistance or current to be measured. After use, the leads are wrapped around the outer surface of the main body. Then, the user utilizes positioning covers to fix the two measuring bars. Although the above kind of electric meter has a measuring effect, the process of wrapping the leads is complicated and wastes time. Further, after being wrapped for a long time, the wires within the leads may be broken or damaged.

Therefore, in order to reduce the problem involved in wrapping the leads of the electric meter, for example, US Patent Publication No. USD427534 discloses an electric meter, which includes a measuring bar integrally formed with a main body and another measuring bar connected with the main body via a lead. However, since one measuring bar is integrally formed with the main body, this measuring bar will be worn inevitably in use. On the other hand, the electric meter may fall off or suffer impact accidentally in use, causing the failure of the electric meter and thus increasing the purchasing cost thereof. Further, since the measuring bars protrude outside the main body, the whole volume of the main body in storage will become large. All the above are the primary drawbacks of prior art and thus it is necessary to be improved.

SUMMARY OF THE INVENTION

The present invention is to provide an electric meter having a detachable measuring bar. Via a detachable connection between a first measuring bar and a main body, when the first measuring bar is worn or damaged in use, the first measuring bar can be replaced with another measuring bar, thereby reducing the purchasing cost of the electric meter.

The present invention is to provide an electric meter having a detachable measuring bar, which includes a main body, a first measuring bar and a second measuring bar assembly. One end of the main body is formed with a supporting portion. The first measuring bar has a connecting portion and a probe formed at the other end of the connecting portion. The connecting portion is detachably connected with the supporting portion of the main body. The second measuring bar assembly comprises a second measuring bar and a lead. Both ends of the lead are connected to the main body and the second measuring bar.

The present invention is to provide an electric meter having a detachable measuring bar. Via the fact that the first measuring bar can be detached from the main body, the whole volume of the electric meter in storage can be reduced, thereby facilitating the use.

DETAILED DESCRIPTION OF THE INVENTION

The detailed description and the technical contents of the present invention will be explained with reference to the accompanying drawings. However, the drawings are illustrative only and are not used to limit the scope of the present invention.

Figure 1:
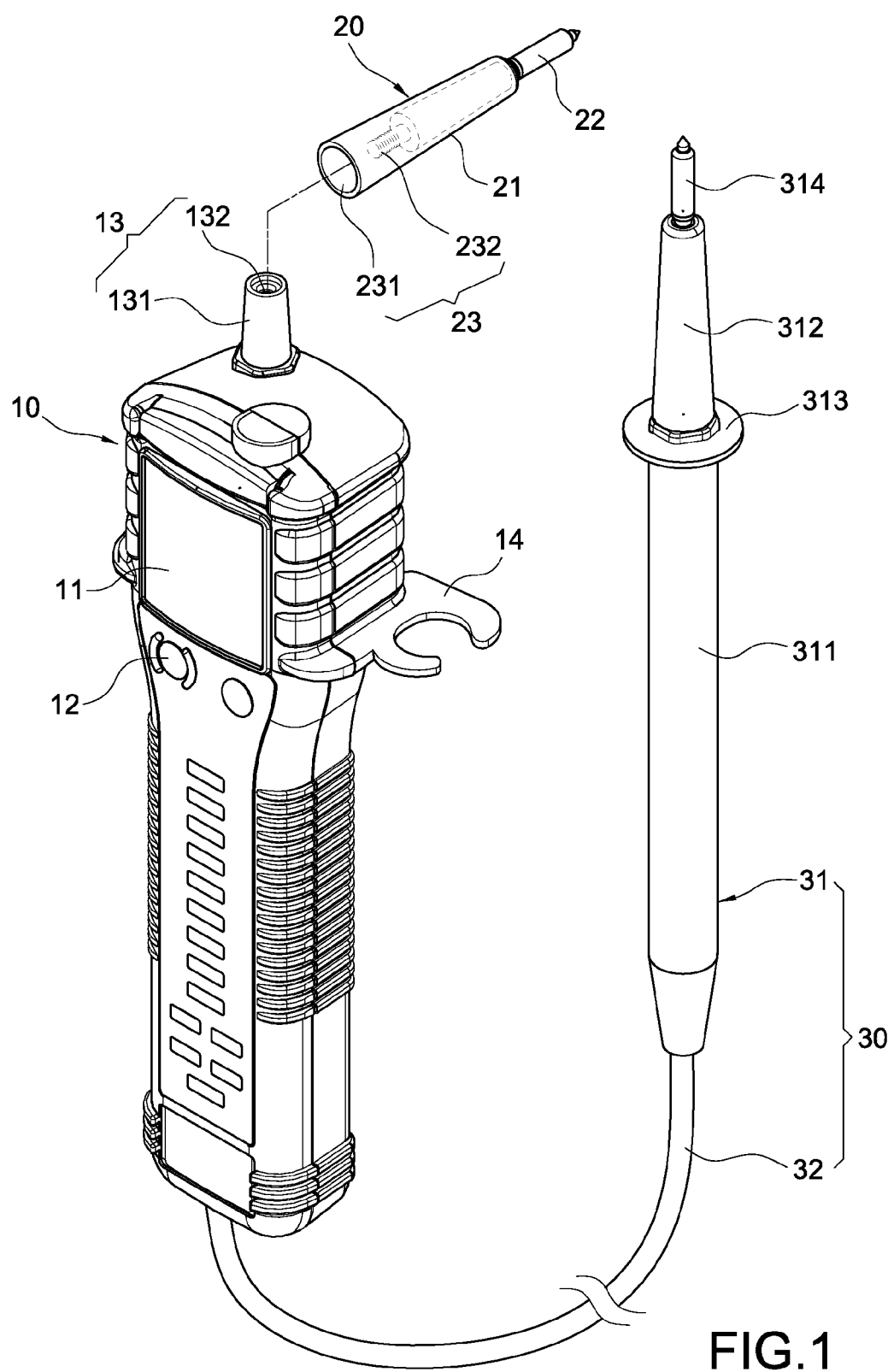
FIG. 1 is an exploded perspective view showing a first embodiment of the present invention.
Figure 2:
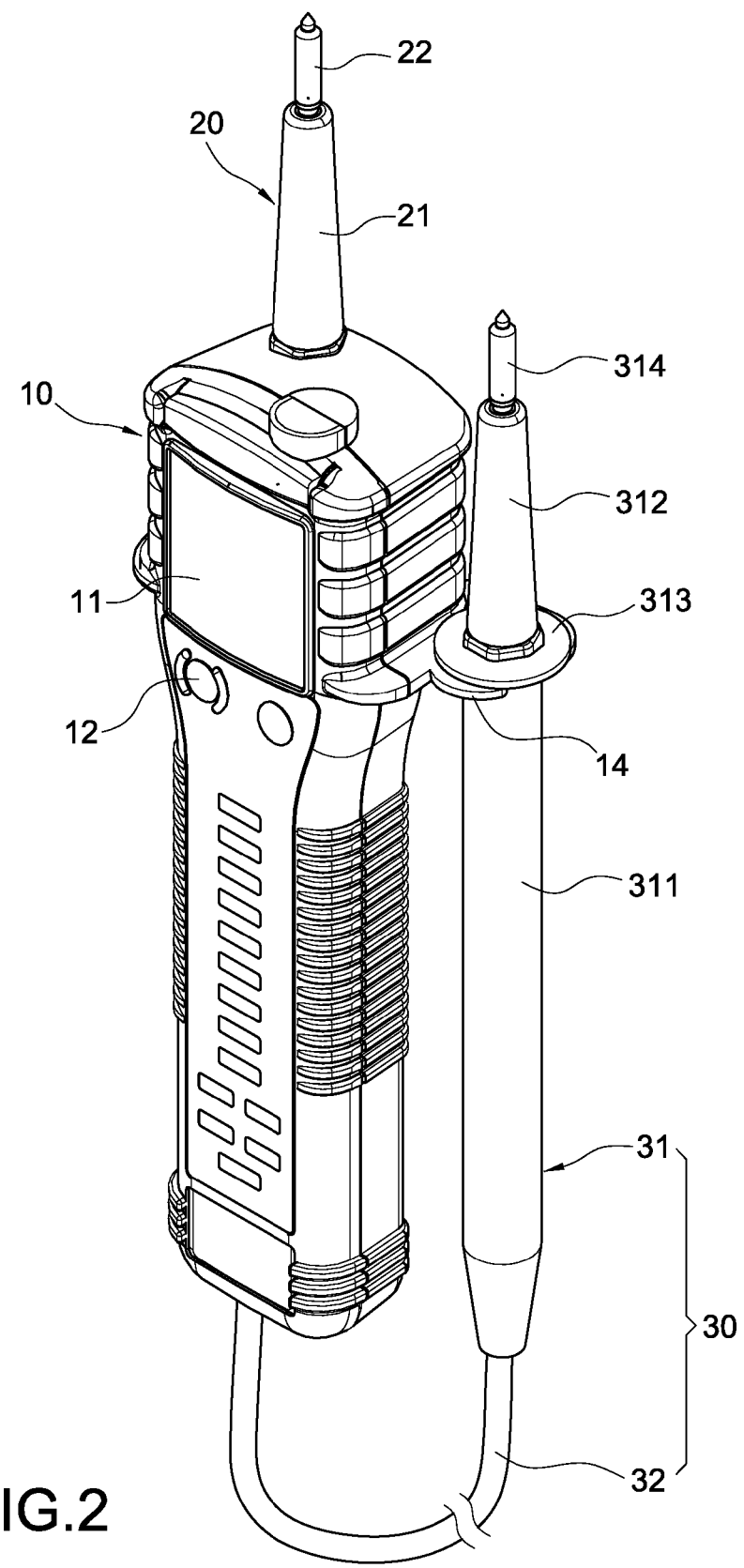
FIG. 2 is an assembled view showing the first embodiment of the present invention.
Figure 3:
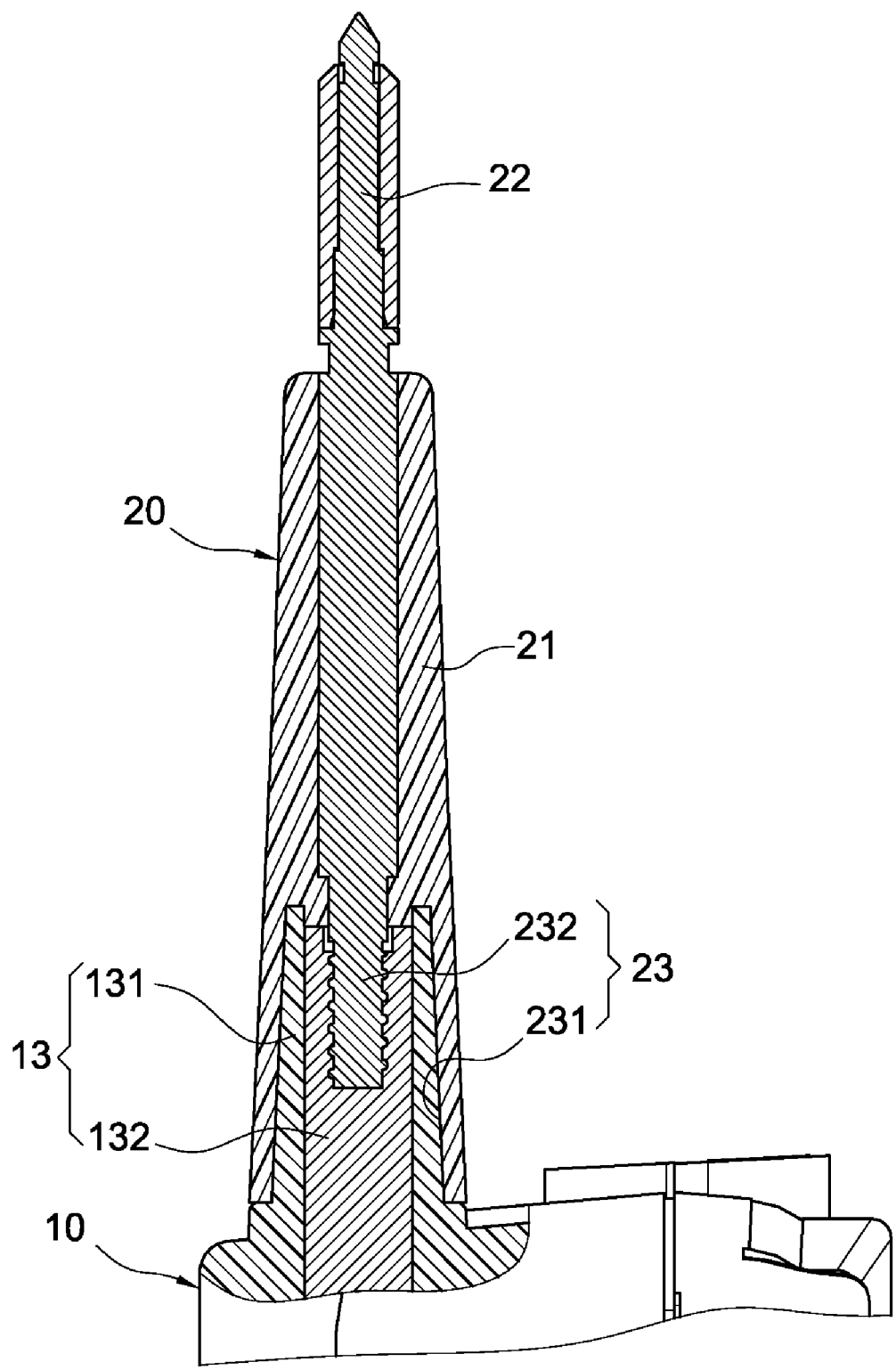
FIG. 3 is a partially cross-sectional view showing the first embodiment of the present invention.

FIG. 1 is an exploded perspective view showing a first embodiment of the present invention. FIG. 2 is an assembled view showing the first embodiment of the present invention. FIG. 3 is a partially cross-sectional view showing the first embodiment of the present invention. The present invention provides an electric meter having a detachable measuring bar, which includes a main body 10, a first measuring bar 20 and a second measuring bar assembly 30.

The main body 10 is formed into a substantially rectangular body and is provided at a front surface thereof with a displayer 11 for displaying the measured data, indicating the amount of electricity remaining in the battery or displaying other information. Further, a plurality of buttons 12 is provided below the displayer 11, so that the user can press the desired buttons according to various conditions. Further, the top surface of the main body 10 is provided with a supporting portion 13. The supporting portion 13 of the present embodiment is constituted of an insulating cylinder 131 extending from the main body 10, and an inner bolt 132 received in the insulating cylinder 131. The inner bolt 132 is made of a conductive material. The other end of the inner bolt is electrically connected with a circuit within the main body 10. Further, a bracket 14 extends from an upper portion of the right side of the main body 10.

The first measuring bar 20 comprises a hollow conical body 21 and a probe 22 penetrating through the conical body 21. The conical body 21 is made of an insulating material and can take various forms of different geometries. The probe 22 is made of a conductive material. One end of the probe protrudes outside the conical body 21. The end of the conical body 21 away from the exposed probe 22 is formed with a connecting portion 23 for connecting to the supporting portion 13. The connecting portion 23 is detachably connected with the supporting portion 13. In the present embodiment, the connecting portion 23 is constituted of a connecting hole 231 formed in the conical body 21, and a conductive screw 232 formed on the probe 22. The connecting hole 231 covers the insulating cylinder 131, and the conductive screw 232 is threadedly connected to the conductive bolt 132 to achieve an electrical connection therebetween, thereby forming a firm construction.

The second measuring bar assembly 30 comprises a second measuring bar 31 and a lead 32. Both ends of the lead are connected to the main body 10 and the second measuring bar 31 respectively. The second measuring bar 31 has a grip 311, a conical body 312 extending from the grip 311, a fixing ring 313 formed at the connecting portion between the grip 311 and the conical body 312, and a probe 314 penetrating into the conical body 312 to be electrically connected with the lead 32. The grip 311, the conical body 312 and the fixing ring 313 are integrally formed and are made of insulating materials. The probe 314 is made of a conductive material. One end of the probe away from the fixing ring 313 protrudes outside the conical body 312.

Figure 4:
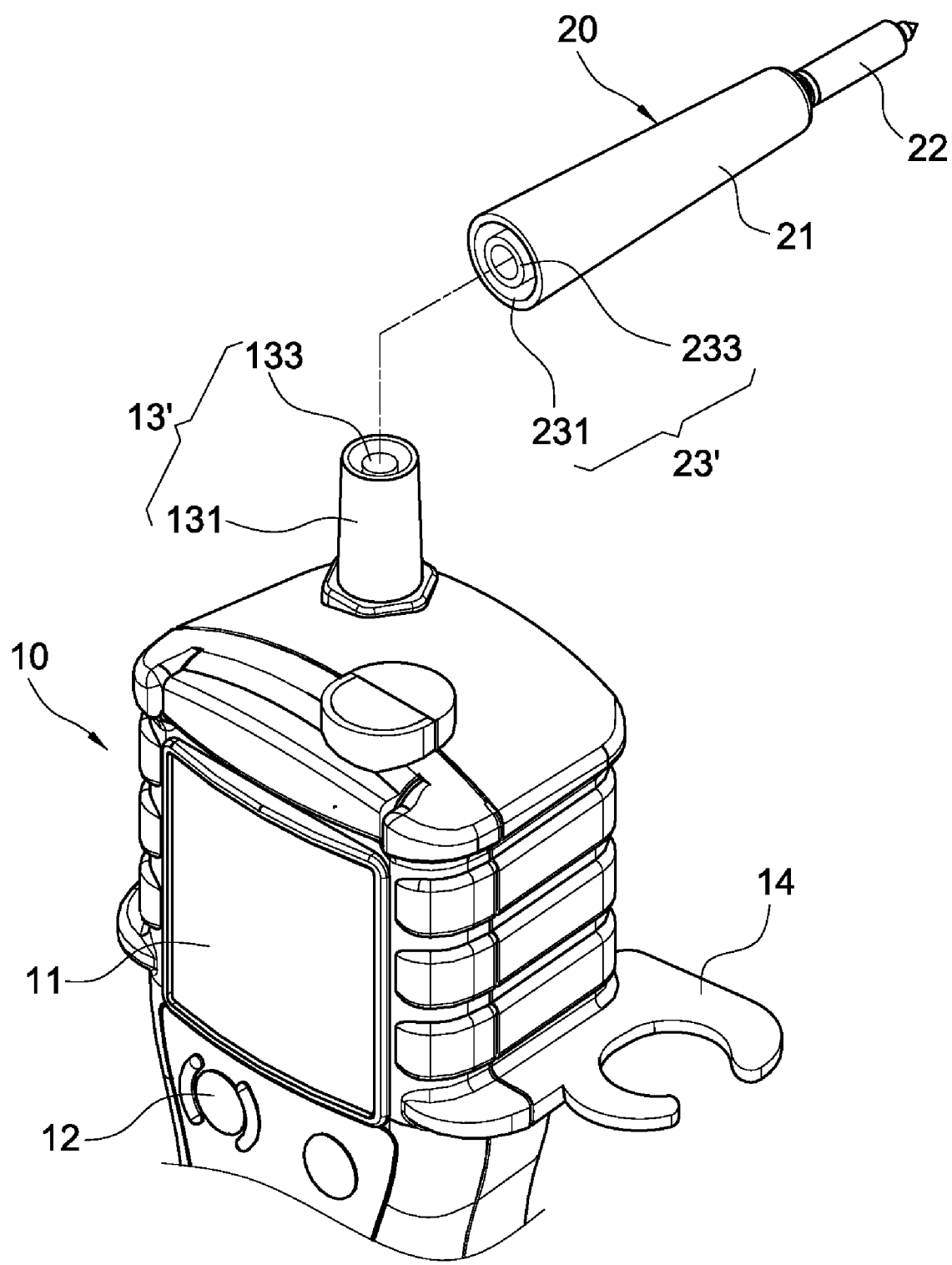
FIG. 4 is an exploded perspective view showing a second embodiment of the present invention.

Please refer to FIG. 4, which is an exploded perspective view showing the second embodiment of the present invention. In addition to previous embodiment, the supporting portion 13 and the connecting portion 23 of the present invention can be made as those shown in the present embodiment. The supporting portion 13' is constituted of an insulating cylinder 131 extending from the main body 10, and a circular conductive pillar 133 received in the insulating cylinder 131. The connecting portion 23' is constituted of a connecting hole 231 formed on the conical body 21 and a conductive sleeve 233 formed at the other end of the probe 22. The connecting hole 231 covers the insulating cylinder 131, so that the conductive sleeve 233 covers the conductive pillar 133 to achieve an electrical connection therebetween, thereby forming a rapidly detachable construction.

Figure 5:
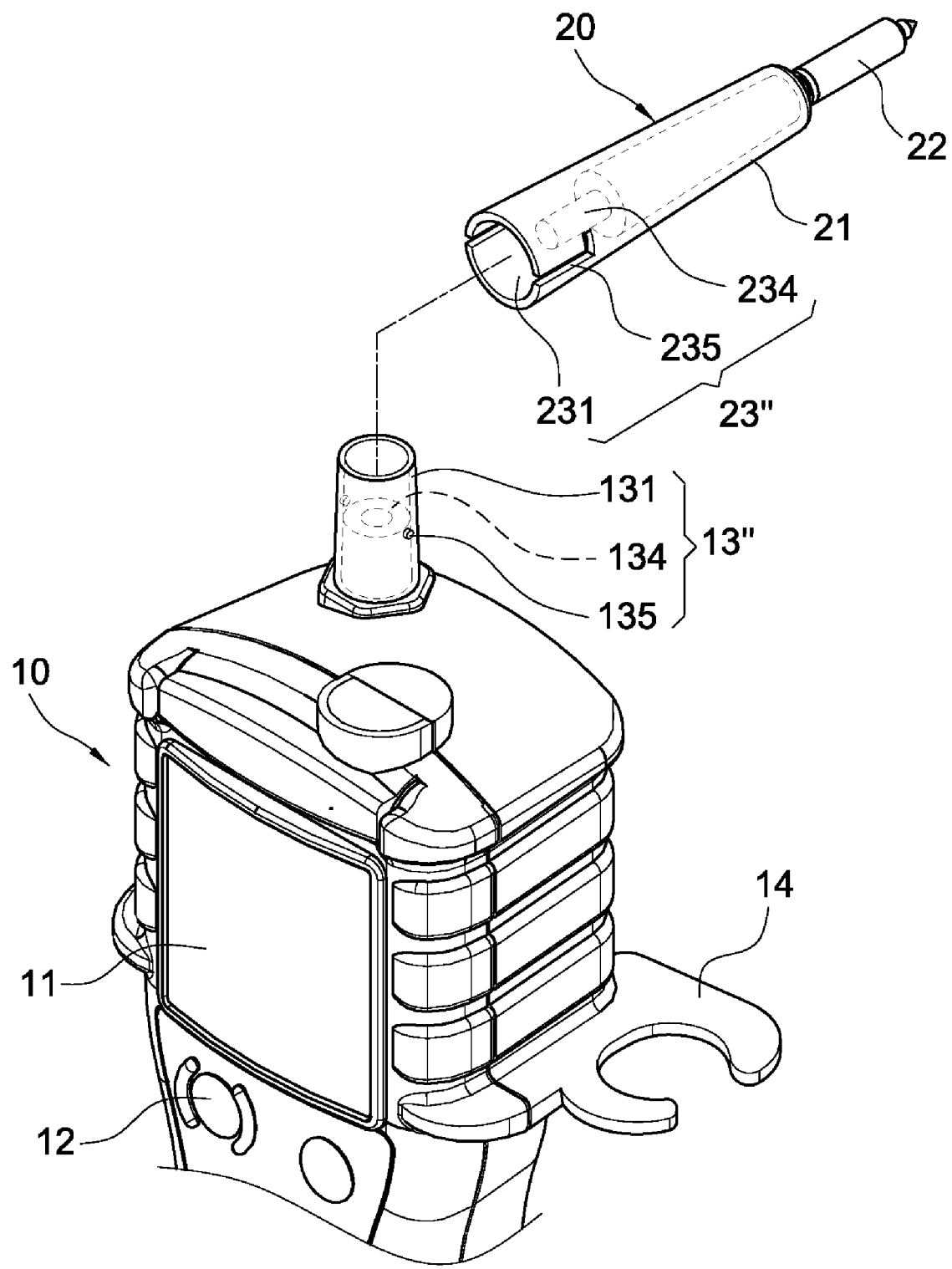
FIG. 5 is an exploded perspective view showing a third embodiment of the present invention.

Please refer to FIG. 5, which is an exploded perspective view showing the third embodiment of the present invention. The supporting portion 13" of the present embodiment is constituted of an insulating cylinder 131 extending from the main body 10, a cylinder 134 received in the insulating cylinder 131, and a positioning pin 135 extending from the outer wall of the insulating cylinder 131. The cylinder 134 is made of a conductive material. The connecting portion 23" is constituted of a connecting hole 231 formed on the conical body 21, a conductive pillar 234 formed on the probe 22, and a positioning trough 235 formed on the conical body 21. The connecting hole 231 covers the cylinder 131. The conductive cylinder 134 allows the conductive pillar 234 to be inserted therein to achieve an electrical connection therebetween. The positioning trough 235 allows the positioning pin 135 to be inserted therein. Via the above arrangement, the falling off and detachment of the first measuring bar during the measuring process can be prevented efficiently.

According to the above, the electric meter having a detachable measuring bar of the present invention really has industrial applicability, novelty and inventive steps. Further, the present invention has not been seen in the articles of the same kind or used in public, and thus conforms to the requirements for a utility model patent.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An electric meter having a detachable measuring bar, comprising:
   a main body, one end of the main body being formed with a supporting portion;
   a first measuring bar having a connecting portion and a probe formed at the other end of the connecting portion, the connecting portion being detachably connected with the supporting portion of the main body; and
   a second measuring bar assembly comprising a second measuring bar and a lead, both ends of the lead being connected to the main body and the second measuring bar,
   wherein the first measuring bar comprises an insulating hollow conical body, and the probe partially penetrates into the conical body;
   wherein the supporting portion comprises an insulating cylinder extending from the main body, the connecting portion comprises a connecting hole formed on the conical body, and the connecting hole covers the insulating cylinder; and
   wherein the supporting portion further comprises a conductive inner bolt received in the insulating cylinder, the connecting portion further comprises a conductive screw formed on the probe, the conductive screw is threadedly connected to the conductive inner bolt to achieve an electrical connection therebetween.

2. The electric meter having a detachable measuring bar according to claim 1, wherein the supporting portion further comprises a conductive pillar received in the insulating cylinder, the connecting portion further comprises a conductive sleeve formed on the probe, the conductive sleeve covers the conductive pillar to achieve an electrical connection therebetween.

3. The electric meter having a detachable measuring bar according to claim 1, wherein the supporting portion further comprises a conductive cylinder received in the insulating cylinder, the connecting portion further comprises a conductive pillar formed on the probe, the conductive cylinder allows the conductive pillar to be inserted therein to achieve an electrical connection therebetween.

4. The electric meter having a detachable measuring bar according to claim 3, wherein the supporting portion further comprises a positioning pin extending from an outer wall of the insulating cylinder, the connecting portion further comprises a positioning trough formed on the conical body, the positioning trough allows the positioning pin to be inserted and fixed therein.

* * * * *